United States Patent [19]

Gilton

[11] Patent Number: 5,445,994
[45] Date of Patent: Aug. 29, 1995

[54] METHOD FOR FORMING CUSTOM PLANAR METAL BONDING PAD CONNECTORS FOR SEMICONDUCTOR DICE

[75] Inventor: Terry L. Gilton, Boise, Id.
[73] Assignee: Micron Technology, Inc., Boise, Id.
[21] Appl. No.: 225,651
[22] Filed: Apr. 11, 1994
[51] Int. Cl.⁶ ............................................. H01L 21/28
[52] U.S. Cl. ............................. 437/183; 228/180.22
[58] Field of Search .............. 437/183, 182, 180, 209; 156/636; 228/180.22

[56] References Cited

U.S. PATENT DOCUMENTS

| | | | |
|---|---|---|---|
| 3,900,352 | 8/1975 | Potter | 437/978 |
| 4,424,527 | 1/1984 | Rao et al. | 357/71 |
| 4,789,648 | 12/1988 | Chow et al. | 437/225 |
| 4,808,552 | 2/1989 | Anderson | 437/187 |
| 4,959,706 | 9/1990 | Cusack et al. | 357/68 |
| 5,036,383 | 7/1991 | Mori | 357/71 |
| 5,053,850 | 10/1991 | Baker et al. | 357/68 |
| 5,126,286 | 6/1992 | Chance | 437/203 |
| 5,146,308 | 9/1992 | Chance et al. | 357/55 |
| 5,149,674 | 9/1992 | Freeman, Jr. | 437/195 |
| 5,151,168 | 9/1992 | Gilton et al. | 205/123 |
| 5,266,446 | 11/1993 | Chang et al. | 437/183 |
| 5,328,553 | 7/1994 | Poon | 156/636 |
| 5,354,711 | 10/1994 | Heitzmann et al. | 437/182 |

FOREIGN PATENT DOCUMENTS 0052572  4/1977  Japan .

Primary Examiner—George Fourson
Assistant Examiner—C. Everhart
Attorney, Agent, or Firm—Stephen A. Gratton

[57] ABSTRACT

A method for forming custom planar connections to the bonding pads of a semiconductor die is provided. The method includes the steps of: depositing a passivation layer on the bonding pads; forming a patterning layer by depositing a dielectric material such as TEOS on the passivation layer; etching through the patterning layer and passivation layer to the bond pads using a first etch mask; etching a connector pattern in the patterning layer using a second etch mask; depositing a metal layer over the patterning layer; and then planarizing the metal layer to an endpoint of the patterning layer to form planar metal connectors having a desired thickness.

18 Claims, 3 Drawing Sheets

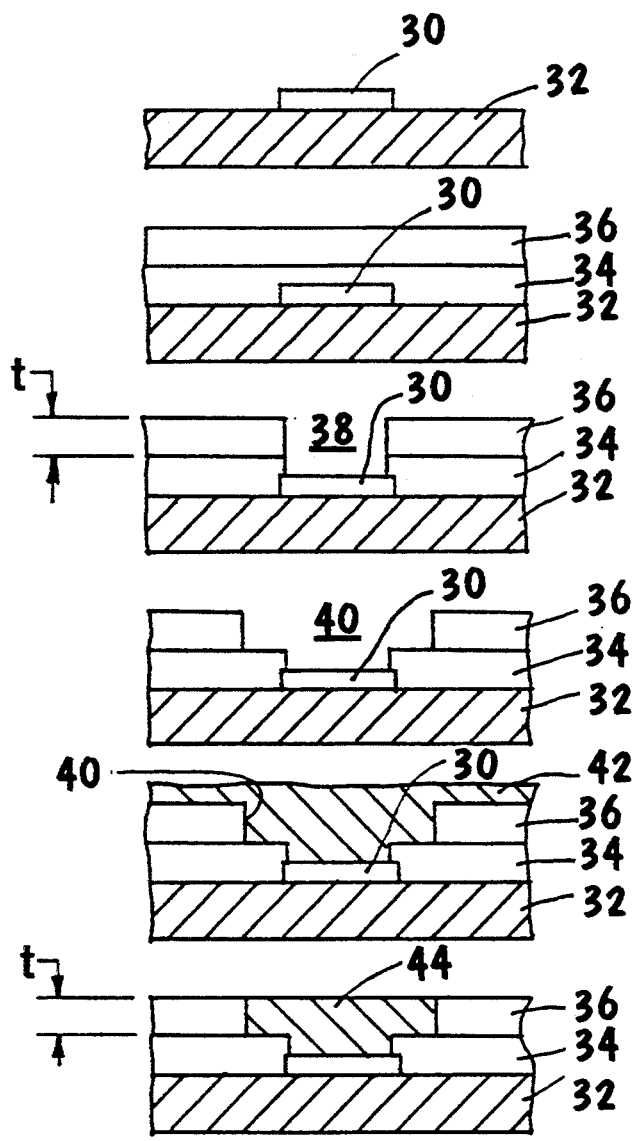

METHOD FOR FORMING CUSTOM PLANAR METAL BONDING PAD CONNECTORS FOR SEMICONDUCTOR DICE

FIELD OF THE INVENTION

This invention relates generally to semiconductor manufacture and specifically to a method for forming custom planar metal connectors to the bonding pads of a semiconductor die.

BACKGROUND OF THE INVENTION

A typical semiconductor die includes external connection points termed "bonding pads" that connect to integrated circuits formed on the die. The bonding pads are used to provide electrical connections between the integrated circuits formed on the die and the outside world. The bonding pads also provide sites for electrical testing. During a wire bonding process some of the bonding pads formed on the face of the die are connected to thin bonding wires which connect to the lead fingers of a leadframe. The bonding wires are the electrical bridge between the bonding pads and the package lead system. Following encapsulation and a trim and form operation, the lead fingers become the external leads of a completed semiconductor package.

FIG. 1 shows a typical packaging arrangement for a semiconductor die 10. Prior to a wire bonding process, the semiconductor die 10 is attached to a die mounting paddle 12 of a leadframe 14 using an adhesive or tape. During the wire bonding process, bonding pads 18 formed on the face of the die 10 are electrically attached to lead fingers 16 of the leadframe 14 using thin bonding wires 20. A wire bonding apparatus bonds the bonding wires 20 to the bonding pads 18 and to the lead fingers 16. This is typically accomplished using heat and pressure. Ultrasound and various other thermal bonding systems are also sometimes employed.

Following wire bonding, the leadframe 14, and die 10, are encapsulated in a plastic or ceramic material. The lead fingers 16 are then trimmed to form the completed semiconductor package or IC (integrated circuit). ICs come in a variety of configurations such as dynamic random access memories (DRAMs), static random access memories (SRAMs) and read only memories (ROMSs).

In addition to wire bonding, other technologies exist, in which bonding pads on a semiconductor die are used for electrically connecting the die to a leadframe or equivalent packaging component. Another technique known as TAB bonding uses bonding pads that are formed with a "bump" of material for attachment to a flexible strip of tape containing printed circuit traces.

In most cases, prior art wire bonding processes are relatively complicated because each bonding pad on the die must be attached to an external lead utilizing some permanent or semi-permanent bonding technique. One problem that exists with the various bonding technologies is that the bonding pads provide only a small surface area for effecting the bond. Inaccuracies in locating this small surface area and making the bond often cause the packaged semiconductor die to be rejected.

As an example, a bonding pad for a wire bonding arrangement is typically formed as a rectangle or square, having an area of less than $10^4 \mu m^2$ (e.g., $10^2 \mu m$ on a side). An automated wire bonding tool must precisely locate each bonding pad and a corresponding lead finger before making a bond. This is a difficult process and requires expensive and complicated equipment.

Wire bonding and other subsequent process steps are further complicated because most prior art bonding pads are embedded in a passivation layer so that the face of the die is non-planar. FIG. 2 is a cross section of a bonding pad 18 attached to a bonding wire 20. The bonding pad 18 is formed of a conductive metal such as A1 and is connected to integrated circuit formed on the die 10 typically with interlevel conducting traces (not shown). A barrier layer 22 and a polysilicon layer 24 separate the bonding pad 18 from an oxide layer 28 of a silicon substrate 29 wherein the active semiconductor devices are formed. A passivation layer 26 formed of a dielectric material or as a sandwich of different materials (e.g., oxide/nitride sandwich) covers the oxide layer 28. The bonding pad 18 is embedded in the passivation layer 26 The bonding pad 18 embedded in the passivation layer 26 forms a tub-like structure. The surface, or face, of the die 10 thus has a non-planar topography.

The non-planar topography provided by the bonding pads and passivation layer sometimes makes control of critical dimensions difficult. This tends to complicate the wire bonding process and subsequent packaging steps. As semiconductor devices have become more complex, problems caused by a lack of planarity tend to increase.

In addition, the location of the bonding pads 18 on the die is sometimes complicated by the leadframe 14 and integrated circuit configurations for the die 10. In some cases the bonding pads 18 are located along the peripheral edges of the die 10. In other cases the bonding pads 18 are inset from the edges of the die. Accordingly the leadframe 14 must be formed with lead fingers 16 having a configuration that corresponds to the spacing and location of the bonding pads 18 and that also permits the bonding wires 20 to be situated at a safe distance from neighboring wires. This not only complicates the configuration of the leadframe 14 and lead fingers 16 but also dictates a specific leadframe configuration for each type of die.

In addition to requiring complex lead finger configurations, most prior art bonding pads are located on the horizontal face of the die. This makes any packaging arrangement, other than a single packaged die, difficult to accomplish. In some applications it would be desirable to have the bonding pads terminate on the edge of a die. This would permit multiple dice to be stacked vertically on edge and connected to a horizontal supporting substrate or motherdie. U.S. Pat. No. 5,146,308 to Chance et al, which is commonly assigned with the present application, describes a method for forming bonding pads on the edge of a die that permits such a stacked arragement.

In view of these and other shortcomings associated with prior art processes for wire bonding and packaging semiconductor dice, it is an object of the present invention to provide a method for forming patterned metal connectors, of any metal, to the bonding pads of a semiconductor die. It is a further object of the present invention to provide a method for forming metal connectors for bonding pads in a pattern that can be customized to match different bonding pad and lead finger configurations and that provides a completely planar surface. It is yet another object of the present invention to provide a method for forming custom metal connectors for bonding pads that is simple, low cost and adaptable to large scale semiconductor manufacture.

SUMMARY OF THE INVENTION

In accordance with the present invention a method for forming custom planar metal connectors to the bonding pads of a semiconductor die is provided. The method of the invention includes the steps of: depositing a passivation layer on the bonding pads; forming a patterning layer by depositing a dielectric material such as TEOS, on the passivation layer; etching openings in the patterning layer and the passivation layer to the bonding pads using a first mask; etching a desired connector pattern in the patterning layer using a second mask pattern; depositing a metal layer over the patterning layer and into the etched connector pattern; and then planarizing the metal layer to an endpoint of the patterning layer to form a planar pattern of metal connectors.

The metal connectors can be formed in a specific pattern that permits an improved leadframe configuration for packaging the die or that matches a particular pattern of bonding pads with a particular leadframe configuration. In addition, the metal connectors can provide a larger surface area to facilitate the wire bonding process. Furthermore, the metal connectors can be formed to the edges of the die to provide edge connectors for the die. The edge connectors can be used to connect a vertical stack of dice on a horizontal substrate to provide a high density integrated circuit.

Other objects, advantages and capabilities of the present invention will become more apparent as the description proceeds.

BRIEF DESCRIPTION OF THE DRAWINGS

FIGS. 3A–3F are schematic cross sectional views of a bonding pad illustrating the steps involved in the method of the invention;

DETAILED DESCRIPTION OF THE PREFERRED EMBODIMENTS

Figure 1:
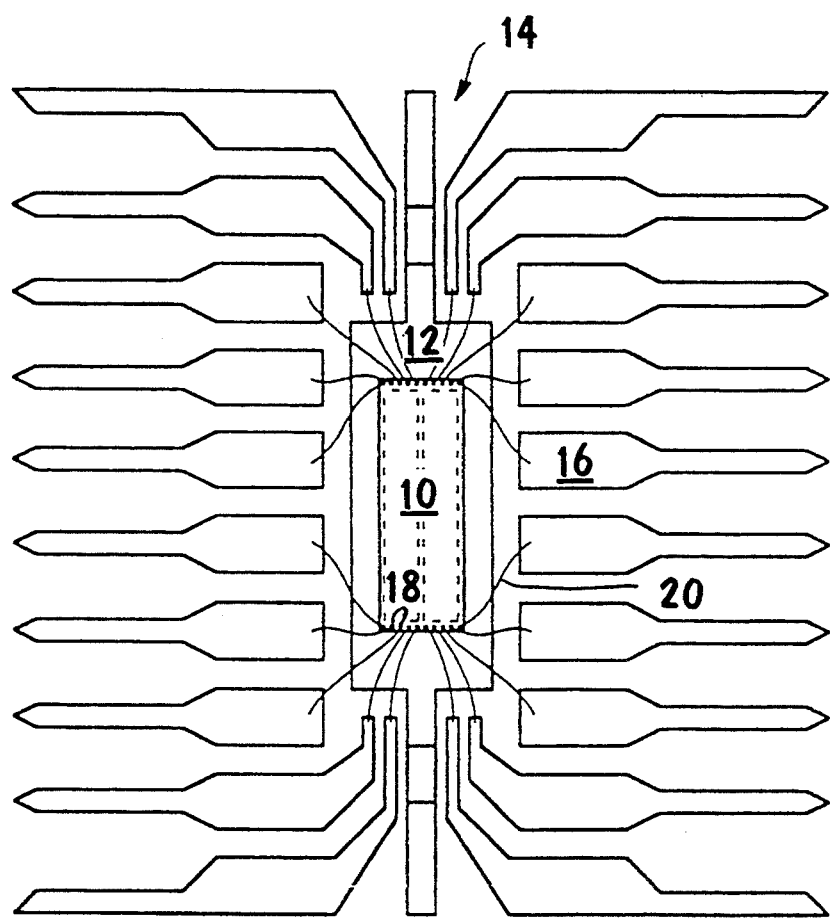
FIG. 1 is a plan view of a prior art semiconductor die and leadframe illustrating a typical wire bonding arrangement.
Figure 2:
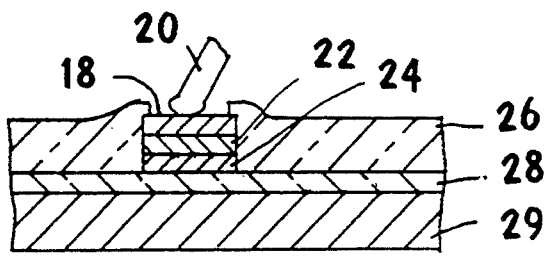
FIG. 2 is a cross sectional view of a prior art bonding pad for a semiconductor structure.

Referring now to FIGS. 3A–3E a process sequence for forming custom planar metal connectors for bonding pads in accordance with the invention is shown. In FIG. 3A a simplified semiconductor structure includes a bonding pad 30 formed on a semiconducting substrate 32. The bonding pad 30 functions as an electrical connection to conduct electrical signals into and out of integrated circuits located on the semiconducting substrate 32. As is apparent, many features of the semiconductor structure (e.g., substrate oxide, barrier layers) that includes the bonding pad 30, that are not necessary for understanding the present invention, are not illustrated.

In general the bonding pad 30 is formed by patterning sequential metal layers so that the bonding pad 30 and the integrated circuits formed on the substrate 32 are interconnected. The bonding pad 30 has a generally rectangular or square peripheral configuration and is formed of a conductive metal or metal alloy. Representative materials include aluminum, copper, titanium, tungsten and alloys of these materials.

Next, as shown in FIG. 3B, a passivation layer 34 is deposited on the substrate 32 and over the bonding pad 30. The passivation layer 34 may be blanket deposited using a suitable deposition process such as CVD, LPCVD or APCVD. The passivation layer 34 may be formed of a dielectric material such as oxynitride, boron phosphosilicate glass (BSPG), phosphosilicate glass (PSG) or silicon nitride.

Next, a patterning layer 36 is deposited on the passivation layer 34 again using a suitable blanket deposition process such as CVD, LPCVD or APCVD. The patterning layer 36 will be subsequently patterned to provide a mold for forming the metal connectors 44 (FIG. 3F) in a desired pattern from the bonding pads 30. A thickness "t" of the patterning layer 36 will later determine a thickness of the metal connectors 44 (FIG. 3F). A representative thickness "t" for the patterning layer is on the order of 2 $\mu$m to 10 $\mu$m.

The patterning layer 36 may be formed of a dielectric or electrically insulating material that can be easily patterned and etched by conventional processes used in semiconductor manufacture. A preferred material for the patterning layer 36 is TEOS. TEOS which is an oxide of silicon derived from tetraethyl orthosilicate is well known in the semiconductor art.

TEOS can be deposited by CVD, plasma enhanced CVD and similar methods. Other suitable materials for the dielectric layer include BPSG (borophosphosilicate glass), spin-on glass and similar dielectric materials.

Next, as shown in FIG. 3C, a dry etch process is used to etch openings 38 through the patterning layer 36 and passivation layer 34 to the bonding pad 30. This etch is termed herein as a "bonding pad etch". For a patterning layer 36 formed of TEOS and a passivation layer 34 formed as an oxide/nitride sandwich, suitable gas etchants include $CHF_3$, $CF_4$, $SF_6$.

Next, as shown in FIG. 3D, a second dry etch process is performed using another etch mask to form openings 40 in the patterning layer 36. This second etch is termed herein as a "patterning layer etch" mask. The pattern of openings 40 formed in the patterning layer 36 are aligned with the openings 38 (FIG. 3C) formed to the bonding pads 30 and will form the layout for the connectors 44 (FIG. 3F) to the bond pads 30. Suitable gas etchants for a TEOS patterning layer 36 are described above. The pattern of openings 40 in the patterning layer 36 are larger than the bonding pads 30 and have vertical sidewalls. Since the patterning layer 36 is formed of a dielectric material rather than a metal, this dry etch process will be relatively easy to perform.

Next, as shown in FIG. 3E, a metal layer 42 is deposited over the patterning layer 36 and into the openings 40. The metal layer 42 completely fills the openings 40 and contacts the bonding pads 30. The metal layer 42 may be formed of any metal deposited by any suitable deposition process. Exemplary metals for forming the metal layer 42 include aluminum, tungsten, molybdenum, copper, titanium or an alloy of these and other metals. Suitable deposition processes include sputtering, CVD or electron beam deposition. In addition, wave soldering techniques similar to those employed for forming patterned conductive lines for printed circuit boards may also be employed to deposit the metal layer 42.

Next, as shown in FIG. 3F, the metal layer 42 is planarized to the endpoint of the patterning layer 36. A suitable method of planarization is with chemical mechanical planarization (CMP). Other methods of planarization, however, such as an etch back process using a dry etch may also be employed. This forms a pattern of metal connectors 44 to the bond pads 30. The surface of the metal connectors 44 and patterning layer 36 is completely planar. In addition the thickness of the metal connectors 44 measured from an endpoint of the passivation layer 34 is "t". (It is understood that the metal connectors 44 in the areas over the bond pads 30 will be as thick as both the patterning layer 36 and pasivation layer 34 but the overall thickness of the metal connectors 44 is referred to herein as "t".)

Figure 4A:
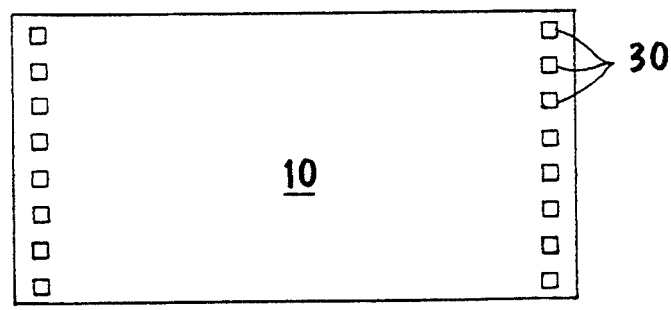
FIG. 4A is a plan view of a semiconductor die illustrating an arrangement of bonding pads on the die.
Figure 4B:
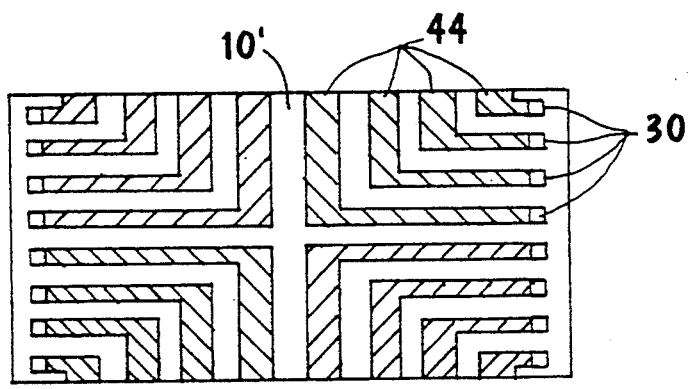
FIG. 4B is a plan view of a semiconductor die illustrating custom planar connectors formed to the bonding pads on the die in accordance with the invention.

Referring now to FIG. 4A, a conventional layout of bonding pads 30 on a semiconductor die 10 is illustrated. As previously explained, this layout of bonding pads 30 may be dictated by the integrated circuit configuration of the die 10. FIG. 4B illustrates a die 10' with a pattern of metal connectors 44, the bonding pads 30 formed as outlined in FIGS. 3A-3F. The pattern of the metal connectors 44 can be customized for a particular application. As an example, the metal connectors 44 can be used to provide a larger surface area for wire bonding. The metal connectors 44 can also be utilized to match a particular pattern of bonding pads 30 to a particular leadframe configuration.

In addition, a particular pattern of metal connectors 44 can be used to improve the performance of a leadframe. As an example, a leadframe for a lead-on-chip (LOC) die is formed without a mounting paddle for the die. With an LOC die, the lead fingers of the leadframe not only electrically attach to the bonding pads via the bond wires, but also adhere to the face of the die and support the die during the encapsulation process. Prior to the encapsulation process, the die, in effect, is mounted to the lower surface of the lead fingers. If the bonding pads are formed close to the edges of the die there is little room for supporting the die. With the method of the invention, the connectors 44 can be positioned relative to the lead fingers of the leadframe to provide an optimal support arrangement.

Furthermore, as clearly shown in FIG. 3F, the metal connectors 44 and patterning layer 36 provide a completely planar surface for the die. The planar surface simplifies critical dimensioning and facilitates the wire bonding and packaging processes.

Figure 5:
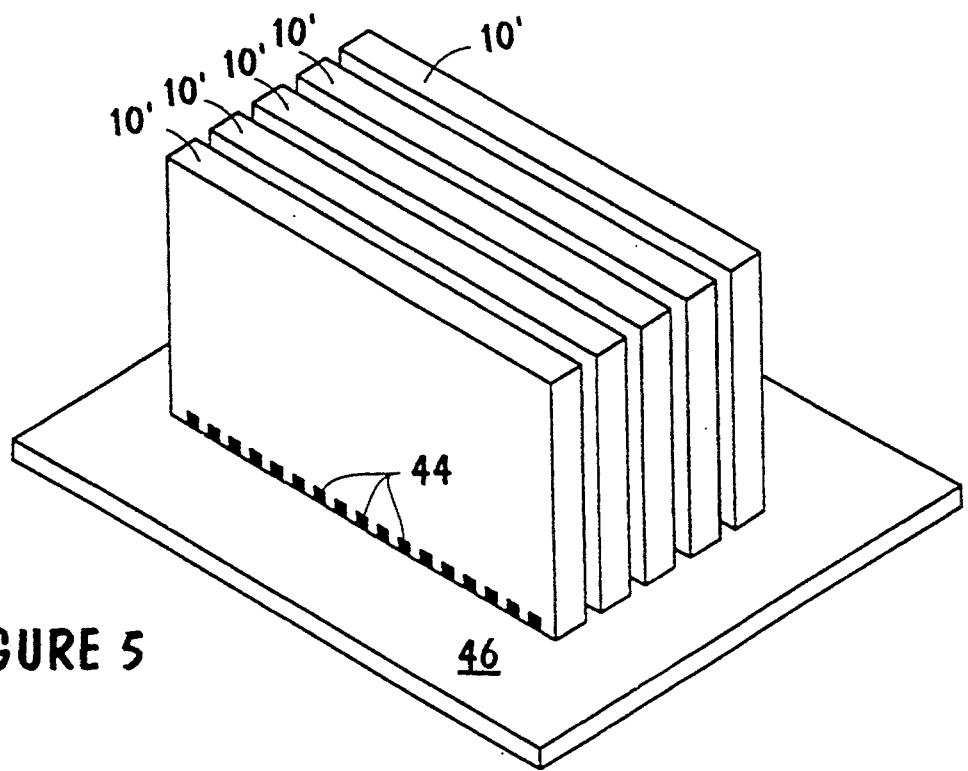
FIG. 5 is a perspective view illustrating multiple semiconductor dice each having custom planar connectors formed in accordance with the invention to an edge of the die with the dice vertically stacked and electrically connected to a supporting substrate.

Still further, as shown in FIG. 4B, the metal connectors 44 for the die 10' can be formed to extend to the edges of the die 10'. In addition a thickness "t" of the metal connectors 44 can be made relatively thick (e.g., 10 μm) as compared to a thickness of conventional bonding pads. As shown in FIG. 5, such an arrangement would permit a plurality of dice 10' to be stacked vertically and mounted to a supporting substrate 46. The connectors 44 at the edges of the dice 10' permit direct electrical connection to the substrate 46 at the interface of dice 10' and substrate 46. This arrangement could be used to form a high density integrated circuit.

Thus the method of the invention permits custom planar connectors to be formed to the bond pads of a semiconductor die. While the method of the invention has been described with reference to certain preferred embodiments, as will be apparent to those skilled in the art, certain changes and modifications can be made without departing from the scope of the invention as defined by the following claims.

I claim:

1. A method for forming planar metal connectors to bonding pads electrically connected to integrated circuits on a semiconductor die comprising:

depositing a passivation layer over the die and bonding pads;

depositing a patterning layer over the passivation layer said patterning layer deposited with a thickness "t";

etching the patterning layer and the passivation layer to form a pattern of openings through the passivation layer and through the patterning layer to the bonding pads;

etching the patterning layer to form a mold for the connectors, said mold having openings aligned with the openings to the bonding pads and formed in a desired pattern;

depositing a metal layer over the patterning layer and into the etched mold and the openings to the bonding pads; and then planarizing the metal layer to an endpoint of the patterning layer to form the connectors in the desired pattern and with the thickness "t".

2. The method as defined in claim 1 and wherein the planarizing step is performed using chemical mechanical planarization.

3. The method as defined in claim 1 and wherein the planarizing step is performed using a dry etch.

4. The method as defined in claim 1 and wherein the patterning layer is formed from tetraethyl orthosilicate (TEOS).

5. The method as defined in claim 1 and wherein the connectors extend to an edge of the die and are sized to facilitate wire bonding to the die.

6. The method as defined in claim 1 and further comprising forming the connectors to an edge of the die and vertically stacking multiple dice on a substrate with each die supported on its edge and with the connectors electrically connected to the substrate.

7. A method for forming planar metal connectors for bonding pads electrically connected to integrated circuits formed on a semiconductor die comprising:

depositing a passivation layer over the bonding pads;

depositing a dielectric material over the passivation layer to form a patterning layer having a thickness of "t" measured from an endpoint of the passivation layer;

etching the patterning layer and the passivation layer using a first etch mask to form bonding pad openings through both layers and to the bonding pads;

etching the patterning layer using a second etch mask to form an etched mold for forming the connectors with a desired pattern, said etched mold having openings aligned with the openings to the bonding pads;

depositing a metal layer over the patterning layer into the etched mold and into the openings to the bonding pads; and then planarizing the metal layer to an endpoint of the patterning layer to form planar connectors to the bonding pads said planar connectors formed in the desired pattern and having a thickness "t".

8. The method as recited in claim 7 and wherein planarizing the metal layer is using chemical mechanical planarization.

9. The method as recited in claim 7 and wherein planarizing the metal layer is by etching back using a dry etch process.

10. The method as recited in claim 7 and further comprising forming the connectors to an edge of the die and vertically stacking the die on edge and electrically connecting the die to a supporting substrate using the connectors.

11. The method as recited in claim 7 and wherein the patterning layer is formed from tetraethyl orthosilicate (TEOS).

12. The method as recited in claim 7 and wherein the thickness "t" is from about 2 μm to 10 μm.

13. The method as recited in claim 7 and wherein the metal connectors are formed in the desired pattern and are sized to facilitate wire bonding to a leadframe for the die.

14. The method as recited in claim 7 and wherein the metal connectors are formed in the desired pattern to facilitate wire bonding to a lead finger configuration of a leadframe for the die.

15. A method for forming planar metal connectors to bonding pads electrically connected to integrated circuits on a semiconductor die comprising:

depositing a passivation layer on a face of the die and over the bonding pads;

depositing a dielectric material over the passivation layer to form a patterning layer having a thickness of "t" measured from an endpoint of the passivation layer;

etching the patterning layer and the passivation layer using a first etch mask to form openings through both layers to the bonding pads;

etching the patterning layer using a second etch mask to form a mold in the patterning layer for forming the connectors, said mold including openings aligned with the openings to the bonding pads and formed in a desired pattern on the face of the die;

depositing a metal layer over the patterning layer and into the mold and openings to the bonding pads; and then planarizing the metal layer to an endpoint of the patterning layer to form planar metal conductors having a thickness of "t" measured from the endpoint of the passivation layer.

16. The method as recited in claim 15 and wherein the metal layer is deposited using a wave soldering process.

17. The method as recited in claim 15 and wherein the patterning layer is formed from tetraethyl orthosilicate (TEOS) deposited by plasma enhanced CVD.

18. The method as recited in claim 15 and wherein the die is a lead-on-chip (LOC) die and the connectors are formed in the desired pattern to facilitate a wire bonding process for the die.

* * * * *